(12) United States Patent
Dover et al.

(10) Patent No.: US 7,391,345 B2
(45) Date of Patent: Jun. 24, 2008

(54) STORING COMPRESSED CODE ON A NON-VOLATILE MEMORY

(75) Inventors: Lance W. Dover, Fair Oaks, CA (US); Brent Ahlquist, Loomis, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/478,204

(22) Filed: Jun. 29, 2006

(65) Prior Publication Data

US 2008/0001789 A1    Jan. 3, 2008

(51) Int. Cl.
    *H03M 7/34* (2006.01)
(52) U.S. Cl. ............................................. 341/51; 341/50
(58) Field of Classification Search .............. 341/50–90
    See application file for complete search history.

(56) References Cited

U.S. PATENT DOCUMENTS

| | | | |
|---|---|---|---|
| 6,145,069 A * | 11/2000 | Dye | 711/170 |
| 6,173,381 B1 * | 1/2001 | Dye | 711/170 |
| 6,304,342 B1 * | 10/2001 | Komada | 358/448 |
| 6,370,631 B1 * | 4/2002 | Dye | 711/170 |
| 6,473,856 B1 * | 10/2002 | Goodwin et al. | 713/2 |
| 6,895,463 B2 * | 5/2005 | Oga et al. | 711/103 |
| 7,133,147 B2 * | 11/2006 | Komada | 358/1.15 |
| 7,145,695 B2 * | 12/2006 | Endo et al. | 358/2.1 |
| 2005/0057546 A1 * | 3/2005 | Shibutani | 345/204 |

* cited by examiner

*Primary Examiner*—Lam T Mai
(74) *Attorney, Agent, or Firm*—Trop, Pruner & Hu, P.C.

(57) ABSTRACT

The time used in manufacturing an electronic device can be reduced by reducing the amount of time taken to store code on non-volatile memories. In one embodiment, storing compressed code to a non-volatile memory can reduce the manufacturing time of an electronic device. The code stored on the non-volatile memory can be decompressed by a controller in the electronic device and loaded on the non-volatile memory for execution by the electronic device.

24 Claims, 5 Drawing Sheets

US 7,391,345 B2

STORING COMPRESSED CODE ON A NON-VOLATILE MEMORY

BACKGROUND

The embodiments of this invention generally relate to storing compressed code on a non-volatile memory during the manufacturing of a device including the non-volatile memory.

The processing capabilities of new generations of electronic devices continue to increase. An increase in processing capabilities allows new features to be added to an electronic device. The new features can result in an increase in the amount of executable code to store on an electric device. The executable code needed to operate the electronic device can be stored on non-volatile memories such as semiconductor memories, ferroelectric polymer memories (FPM), magnetic memories, phase change memories and other memories that have been developed or proposed for use in an electronic device.

Semiconductor memories including NOR-based flash technology can be installed in an electronic device during the manufacturing of that electronic device. Code can be stored on the non-volatile memory during the manufacturing of an electronic device to be read and executed by the electronic device after manufacturing is complete.

DETAILED DESCRIPTION

In various embodiments, techniques may be used to decrease the amount of time that is used to store code on a non-volatile memory during the manufacturing of an electronic device. Manufacturing an electronic device can include a critical path. The critical path is the time it takes to store code on a memory while all other processes related to manufacturing the electronic device are suspended. Reducing the critical path can result in a reduction of the overall manufacturing time, in one embodiment.

The manufacturing of an electronic device, for example a cellular telephone, can begin by obtaining a printed circuit board and electronic components. The electronic components can be soldered to the printed circuit board to make connections between the electronic components. A non-volatile memory can be installed in the electronic device to store code. The non-volatile memory can be in the same package as a controller. In one embodiment, the controller can store code on the non-volatile memory, erase the non-volatile memory, or decompress code stored on the non-volatile memory. If the components are connected and the non-volatile memory is installed, compressed code can be stored on the non-volatile memory. If code is being stored on the non-volatile memory, no components can be installed and no testing can begin on the components installed until the storage of the code is complete.

As the capabilities of electronic devices and the amount of code to operate these electronic devices increase, the time that it takes to store code on non-volatile memories during the manufacturing of the electronic device also increases. Reducing the amount of time that it takes to store code on a non-volatile memory during the manufacturing of an electric device may reduce the amount of time that other manufacturing processes are suspended. In one embodiment, a reduction in the time taken to transfer code to a non-volatile memory can be realized by reducing the amount of code to be stored on the non-volatile memory. Compressing the code can reduce the amount of code to be stored on a non-volatile memory. To execute a compressed code, the code can be decompressed and stored on the non-volatile memory used to store the compressed code.

Figure 1:
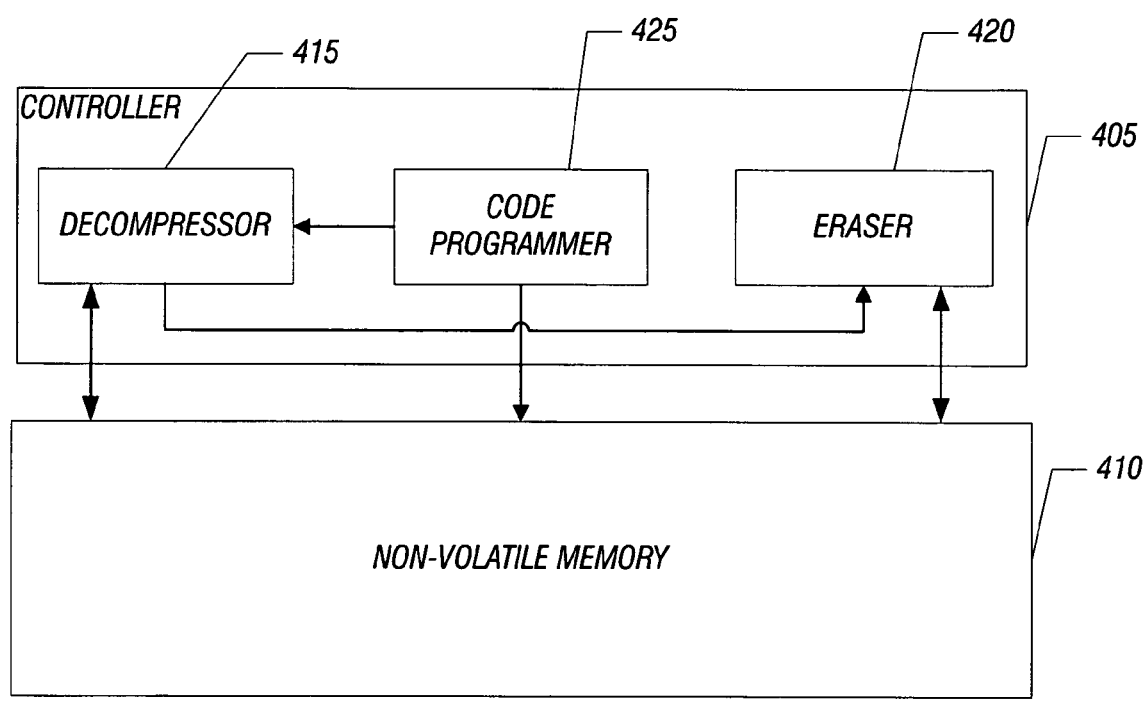
FIG. 1 is a block diagram in accordance with one embodiment of a non-volatile memory and a non-volatile memory controller.

FIG. 1 is a block diagram in accordance with one embodiment of a non-volatile memory 410 and a non-volatile memory controller 405. The controller 405 can include a decompressor 415, an eraser 420, and a code programmer 425.

A processor can send compressed code to the code programmer 425. The code programmer 425 can store the code on the non-volatile memory 410. In one embodiment, the compressed code may be broken into fragments before it is sent to the code programmer 425.

The decompressor 415 can detect if code programmer 425 is no longer storing the compressed code on the non-volatile memory 410. The decompressor 415 can read the compressed code, decompress the code, and store the decompressed code on the non-volatile memory 410. The code may be decompressed in fragments, in one embodiment.

The eraser 420 can erase compressed code that has been decompressed by the decompressor 415. In one embodiment, the eraser 420 erases compressed fragments corresponding to code fragment decompressed by the decompressor 415 before all the compressed fragments are decompressed. The eraser can also receive a signal from a processor to erase a block of the non-volatile memory 410.

The controller 405 can be coupled to a decompressor 415, in one embodiment. In an alternative embodiment, the controller 405 can include a decompressor 415. In one embodiment, the controller 405 and the non-volatile memory 410 can be one component. The controller 405 and the non-volatile memory 410 can be separate components, in one alternative embodiment.

The decompressor 415 can decompress a compressed code fragment stored on the non-volatile memory 410 and store the decompressed code fragment on the non-volatile memory 410. The decompressor 415 can join the decompressed code fragments.

In one embodiment, the decompressor 415 can be included in the hardware of the controller by changing the die of the controller. In an alternative embodiment, the controller can be updated with a new microcode that can be executed to decompress the compressed code stored in the non-volatile memory 410. The microcode can be stored on the controller to define how the controller operates.

Figure 2:
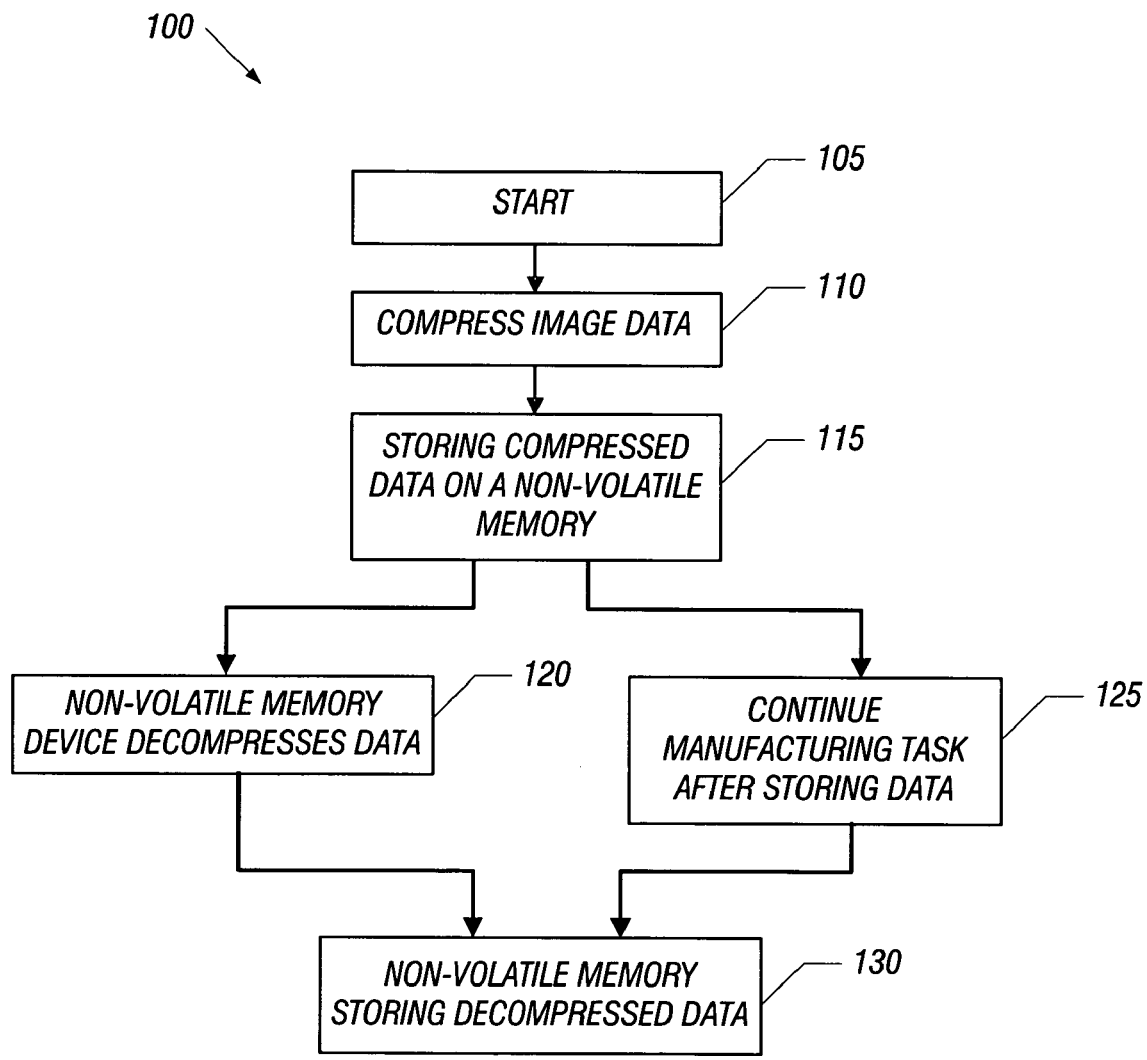
FIG. 2 is a flow chart for one embodiment of a method of storing code on a non-volatile memory.

FIG. 2 is a flow chart for one embodiment of a method of storing code on a non-volatile memory during the manufacturing of a device with the non-volatile memory. The method of storing code on a non-volatile memory 100 begins at block 105. The code to be stored on a non-volatile memory can be compressed at block 110. The compressed code can be stored on the non-volatile memory at block 115. If the non-volatile memory is installed into an electronic device, the controller for the non-volatile memory can be used to store the code on the non-volatile memory. A processor that can be used to send compressed code to the controller is a processor with ARM® architecture, available from Intel Corporation of Santa Clara, Calif.

While storing compressed code on the non-volatile memory at block 115, manufacturing tasks related to the manufacturing of the electronic device that includes the non-volatile memory may be suspended, in one embodiment. After storing the code on the non-volatile memory at block 115, the manufacturing tasks related to the manufacturing of the electronic device may be resumed at block 125, in one embodiment. A controller for the non-volatile memory can decompress the code at block 120 that was stored on the non-volatile memory at block 115. After the decompression of the code at block 120 and the manufacturing task at block 125 are completed, a non-volatile memory with decompressed code is obtained at block 130. In one embodiment, the decompressed code on the non-volatile memory can be executed from the non-volatile memory without being read from the non-volatile memory and stored in another memory prior to executing the code.

In one embodiment, a controller for the non-volatile memory can decompress the code at block 120 and load the code back on the non-volatile memory. In alternative embodiment, a controller for the non-volatile memory can decompress and temporarily load the compressed code on another memory during the decompression. The decompressed code on the other memory can then be loaded back on the non-volatile memory.

Figure 3:
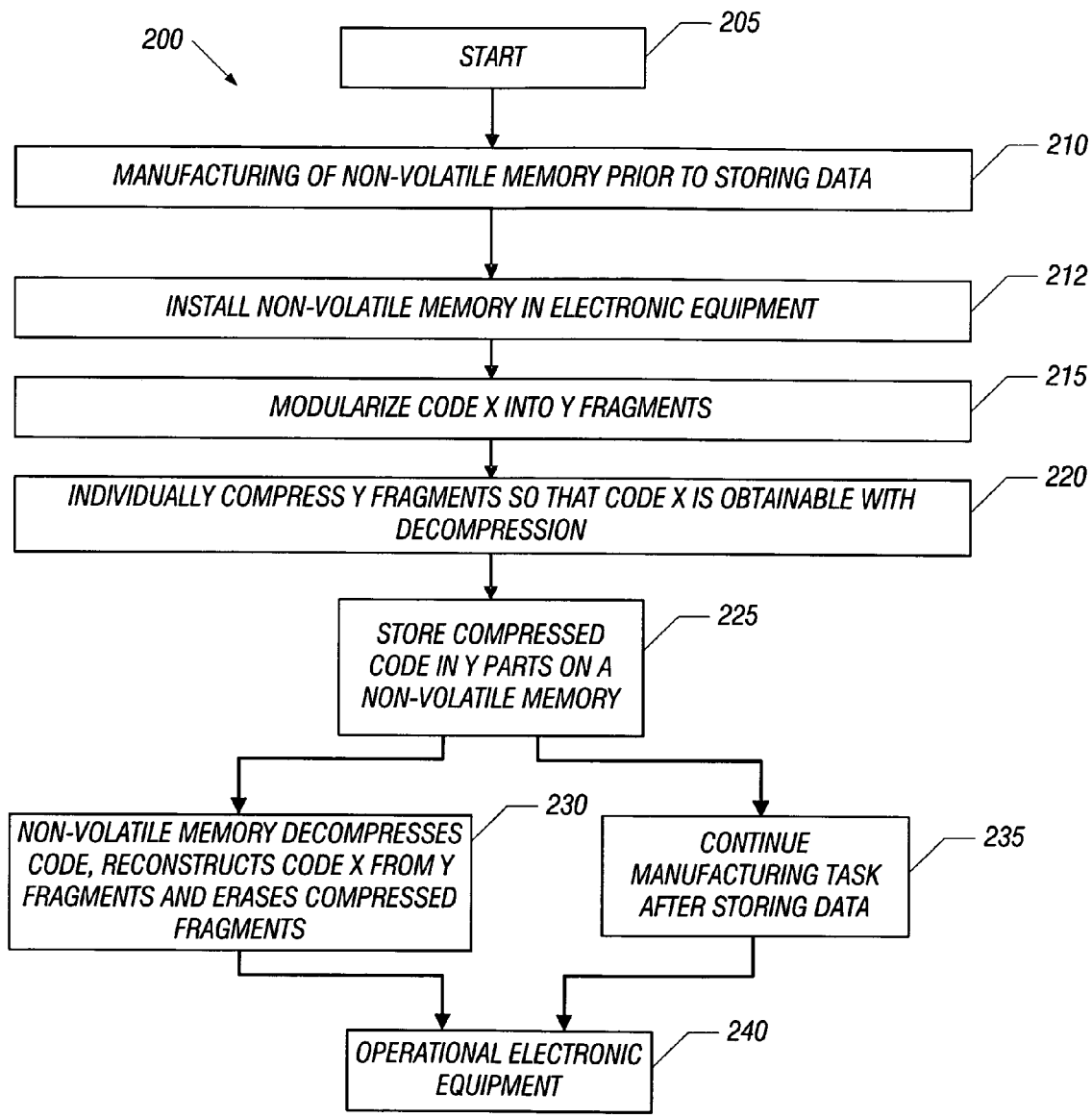
FIG. 3 is a more detailed flow chart for one embodiment of a method of storing code on a non-volatile memory.

FIG. 3 is a more detailed flow chart for one embodiment of a method of storing code on a non-volatile memory during the manufacturing of a device with non-volatile memory. A method of storing code on a non-volatile memory 200 can begin at block 205. The manufacturing of an electronic device prior to storing code on the non-volatile memory can include soldering of electronic components to a printed circuit board at block 210. A non-volatile memory can be installed in the electronic device at block 212.

The non-volatile memory can store a code that can be executed by electronic device. Before storing a code X on a non-volatile memory, a compressor can determine that the code X can be broken into Y fragments at block 215. The Y fragments can be compressed with lossless compression at block 220. A lossless compression technique can compress code into a format that can be used to recover the original code with no variations. Lossless compressions techniques that may be used in one embodiment are Huffman or Lempel-Ziv-Welch (LZW) although the present embodiments are not limited to a type of compression.

The compressed fragments can be stored on the non-volatile memory at block 225. A controller for the non-volatile memory in an electronic device can decompress the compressed fragments and reconstruct the code X from the Y fragments at block 230. The controller for the non-volatile memory can also erase compressed code fragments, in one embodiment.

The operation of the controller can be defined by microcode stored on the controller. Embodiments of the microcode or higher level code, such as a C programming language that may be compiled into microcode, may be stored on a computer readable media such as a storage medium along with instructions, which can be used to program a controller to execute instructions. The instructions can store code on a non-volatile memory in an electronic device. The instructions can decompress compressed code on the non-volatile memory with a controller on an electronic device. The instructions can also erase the compressed code stored on the non-volatile memory.

The storage medium may include but is not limited to any type of disks, including floppy disk, optical disk, compact disk, read only memories such as CD ROMS, compact disk re-writeables (CD-RWs) and magneto optical disks, semiconductor devices such as read only memories (ROMs), Random Access Memories (RAMs) such as dynamic random access memories (DRAMs), static random access memories (SRAMs), erasable programmable read only memories (EPROMs), flash memories, electronically erasable programmable read only memories (EEPROMs), magnetic and optical cards or any other type of media suitable for storing electronic instructions.

After Y fragments are stored on the non-volatile memory, manufacturing tasks suspended during the storage of the code on the non-volatile memory at block 225, can continue at block 235. In one embodiment, manufacturing of the electronic device at block 235 may include a series of tests to determine if the storing of the compressed code was successful and if the electronic device is operating properly. After the decompression of code at block 230 and the manufacturing at block 235, operational electronic equipment can be obtained at block 240.

In one embodiment, the code stored on a non-volatile memory during manufacturing of the electronic device is an execute in place image. An execute in place image can be code to implement different functions on an electronic device. An execute in place image can reside on non-volatile memory in a decompressed form. The electronic device can execute the execute in place image if the execute in place image is in a decompressed form. In one embodiment, the compressed execute in place image may be decompressed and loaded on a random access memory if the electronic device is activated. An electronic device can be manufactured without a random access memory for storing the decompressed execute in place image, in one embodiment, if the decompressed execute in place image is loaded to a non-volatile memory.

The compressed execute in place image can be decompressed and loaded on the non-volatile memory used to store the compressed execute in place image. In one embodiment, execution speed in the electronic device is increased because decompressing and loading the execute in place image to a random access memory is not performed.

If a compressed code fragment is decompressed and loaded on the non-volatile memory, the compressed code fragment can be erased allowing other compressed code fragments to be decompressed and loaded into a memory area previously occupied by a compressed code fragment. For example, a non-volatile memory has a capacity of 512 megabytes and stores a code compressed 50% and totaling 250 megabytes. In the example, the decompressed code may not be able to be loaded on the non-volatile memory because the compressed code of 250 megabytes and the decompressed code of 500 megabytes totals 750 megabytes, which is more than the capacity of the 512 megabyte non-volatile memory. If code was decompressed in fragments, a compressed 5 megabyte fragment, for example, can be decompressed to 10 megabytes and the 5 megabyte fragment can be erased, allowing the incremental increase from 250 megabytes of compressed code to 500 megabytes of decompressed code in 5 megabyte increments. This may allow a manufacturer of an electronic device to use a smaller non-volatile memory to save costs, in one embodiment.

Space remaining on a non-volatile memory after the code is decompressed may be used to store other code on the electronic device, in one embodiment. For example, the decompressed code of 500 megabytes can result in 12 megabytes of unused space that can be used to store other code on the non-volatile memory of the electronic device. Storing compressed code on a non-volatile memory may be applied to storing code on a basic input-output system chip in a computer system.

Figure 4:
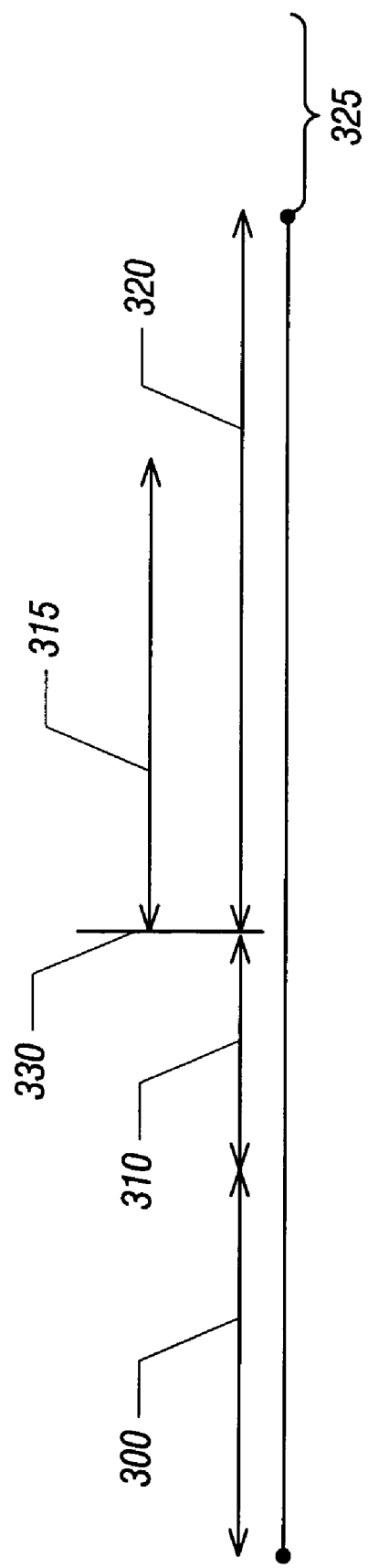
FIG. 4 is a timing diagram representing one embodiment of storing code on a non-volatile memory.

FIG. 4 is a timing diagram representing one embodiment of storing code on a non-volatile memory. The manufacturing time 300, can be used for soldering electronic components onto a printed circuit board, in one embodiment. The manufacturing time 300 can also be used to install a non-volatile memory onto the printed circuit board. The manufacturing time 300 may be used for compressing a code. The storage time 310 may be used to store the compressed code on the non-volatile memory. During the storage time 310, the manufacturing of the electronic device may be suspended, in one embodiment. After the storage time 310, the second manufacturing time 320 can begin.

The non-volatile memory can wait to begin the decompression time 315 until after the storage time 310. During the decompression time 315, the non-volatile memory can decompress and reconstruct the compressed code stored during the storage time 310. The decompression time 315 can be used to load the decompressed code on the non-volatile memory. A transition point 330 can signify the compressed code is stored and decompression of the code can begin. In one embodiment, power can be applied any time after the transition point 330 to the controller for the non-volatile memory so that the controller can begin decompression. The controller can decompress and reconstruct the code automatically after the compressed code is stored on the non-volatile memory and power is applied to the controller of the non-volatile memory. The time 325 can be the difference between the time used to store a compressed code during the storage time 310 and the time for storing a decompressed code during the storage time. The time 325 can be the reduction in the manufacturing time.

In one embodiment, the decompression and reconstruction of the code during the decompression time 315 may occur after the manufacturing process has concluded or anytime that power is applied to the non-volatile memory.

In one embodiment, storing the compressed code in fragments during the storage time 310 can result in the fragments being decompressed at different times until the code stored to the non-volatile memory is decompressed. For example, if power is applied to a non-volatile memory, and before fragments can be decompressed power is removed, the remaining compressed fragments can be decompressed if power is restored to the non-volatile memory.

Figure 5:
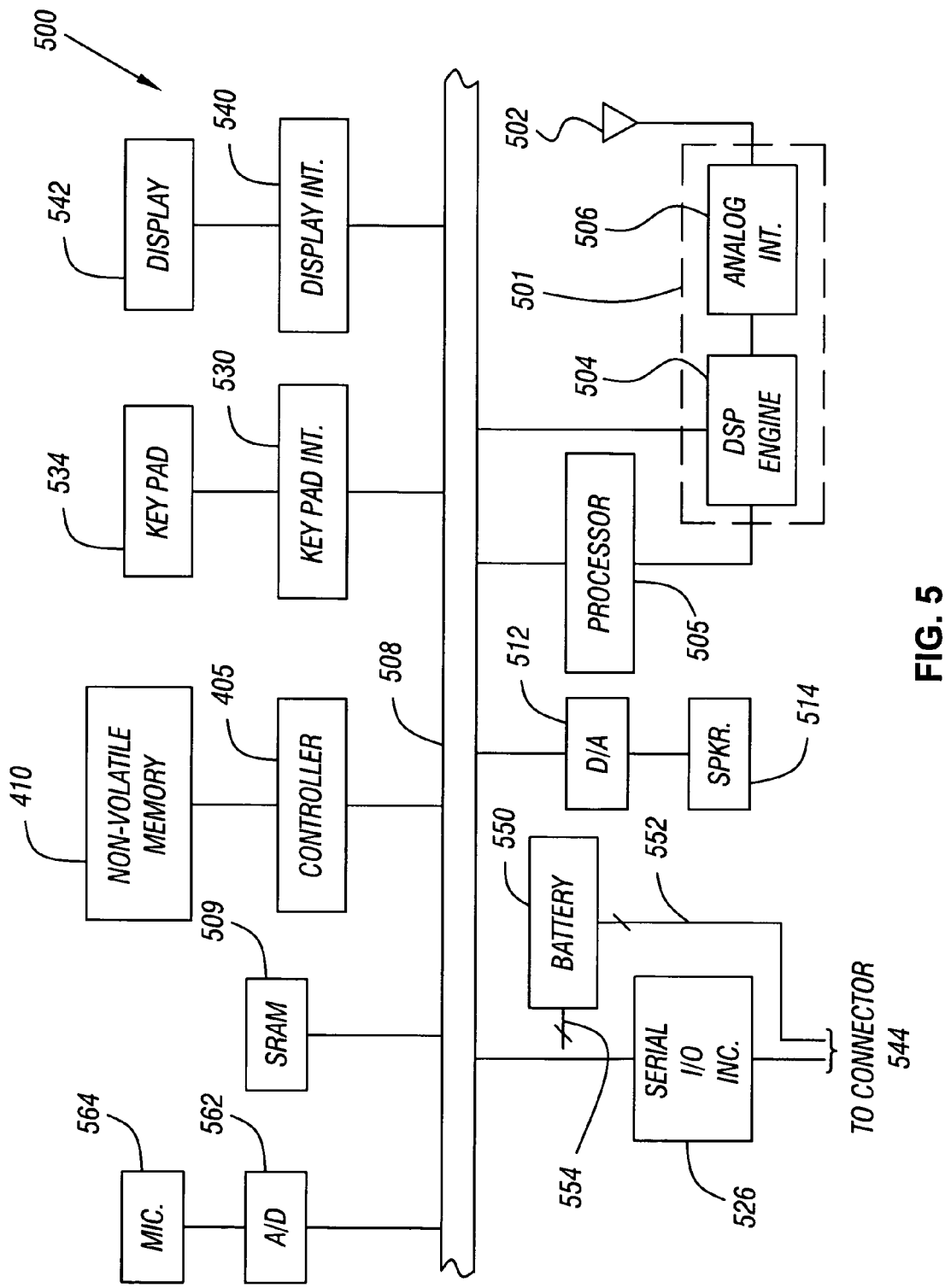
FIG. 5 is a block diagram of a cellular phone with which embodiments of the present invention may be used.

FIG. 5 is a block diagram of a electronic system, for example a cellular telephone 500, with which embodiments of the present invention may be used. The cellular telephone 500 includes a transceiver 501 that serves as an interface of the cellular telephone 500 to a cellular antenna 502. In this manner, the transceiver 501 includes an analog interface 506 to communicate analog signals with the antenna 502 and provide digital data to a digital signal processing (DSP) engine 504 that decodes received and encodes outgoing data. The DSP engine 504 is coupled to a bus 508 of the cellular telephone 500 to communicate data with a memory 509, for example a static random access memory (SRAM) of the cellular telephone 500. A processor 505 can refer to a multi-core processor. The processor 505 can be coupled to the bus 508 to direct the communication of data between the memory 509 and the transceiver 501. In this manner, if incoming data is received, the processor 505 can transfer the data from the memory 509 to a digital-to-analog converter 512 to a speaker 514 to play audio. Similarly, the processor 505 directs captured voice data from a microphone 564 through an analog-to-digital (A/D) converter 562 to the memory 509.

The cellular telephone 500 can include an input/output (I/O) interface 526 that establishes electrical connection with the connector 544. In this manner, the I/O interface 526 may receive compressed code from the connector 544, and the compressed code can be sent from the processor 505 to the controller 405 to store on the non-volatile memory 410. The processor 505 may execute a code stored on the non-volatile memory 410. The processor 505 may receive a request to furnish code that is stored in the non-volatile memory 410. Using the processor of a cellular telephone 500 to send compressed code to the controller 405, may reduce costs in some embodiments.

Among the other features of the cellular telephone 500, a key pad 534 may be used to enter telephone numbers and may be interfaced between the bus 508 via a keypad interface 530. Furthermore, the processor 505 may drive a display 542 through a display interface 540 that is coupled between the display 542 and the bus 508. The cellular telephone 500 also includes a battery 550 that is coupled to conductive traces, or lines 554, to supply power to the components of the cellular telephone and is coupled to conductive traces, or lines 552, that extend to and are accessible through the connector 544. The lines 552 may be used for purposes of charging the battery 550.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    automatically decompressing, using a controller in an electronic device, a compressed code stored on a non-volatile memory at the time of manufacturing the electronic device;
    loading decompressed code generated from the compressed code to the non-volatile memory; and
    compressing the decompressed code in fragments and storing the compressed code on the non-volatile memory.

2. The method of claim 1, including applying a decompression algorithm stored on the controller to the compressed code.

3. The method of claim 2, including testing the electronic device while applying the decompression algorithm to the compressed code.

4. The method of claim 1, including erasing the compressed code from the non-volatile memory after the decompressed code is loaded to the non-volatile memory.

5. The method of claim 1, including decompressing the compressed code in fragments.

6. The method of claim 5, including erasing a fragment of the compressed code if the fragment is stored as decompressed code on the non-volatile memory.

7. The method of claim 5, including linking the fragments of the decompressed code.

8. A computer readable medium comprising instructions that, if executed, enable a processor-based system to perform:
    storing a compressed code fragment on a non-volatile memory in an electronic device;
    decompressing the compressed code fragment stored on the non-volatile memory with a controller in the electronic device; and erasing the at least one compressed code fragment corresponding to the decompressed code fragment.

9. The computer readable medium of claim 8, further comprising instructions that, if executed, enable the system to perform storing other code in the non-volatile memory after the compressed code fragments are erased.

10. The computer readable medium of claim 8, further comprising instructions that, if executed, enable the system to perform linking a plurality of decompressed code fragments to form decompressed code.

11. The computer readable medium of claim 10, further comprising instructions that, if executed, enable the system to perform reading the decompressed code stored on the non-volatile memory and to execute the decompressed code.

12. The computer readable medium of claim 8, further comprising instructions that, if executed, enable the system to perform storing the compressed code, to erase the compressed code and to decompress the compressed code.

13. The computer readable medium of claim 8, further comprising instructions that, if executed, enable the system to perform searching for the compressed code fragment on the non-volatile memory if power is applied to the non-volatile memory.

14. The computer readable medium of claim 13, further comprising instructions that, if executed, enable the system to perform applying a decompression algorithm to the compressed code fragment.

15. A memory component to install in an electronic device comprising:
a non-volatile memory;
a first controller to store compressed code fragments to operate the electronic device on the non-volatile memory, the first controller to decompress compressed code fragments stored on the non-volatile memory, and the first controller to load the decompressed code fragments on the non-volatile memory; and
a second controller coupled to the first controller to send the compressed code fragments to the first controller to store in the non-volatile memory.

16. The device of claim 15, including the second controller to generate compressed code fragments.

17. The device of claim 15, including the controller to store the compressed code, to erase the compressed code and decompress the compressed code on the non-volatile memory.

18. The device of claim 17, including the controller to erase the compressed code fragments if the compressed code fragments are decompressed.

19. The device of claim 15, including a processor to execute a program stored as decompressed code on the non-volatile memory.

20. The device of claim 15, including a decompression algorithm stored in the controller as microcode.

21. An electronic system comprising:
a non-volatile memory;
a processor in the electronic system to execute decompressed code on the non-volatile memory;
a static random access memory coupled to the processor; and
a controller in electronic system to store compressed code fragments to operate the electronic system, the controller to decompress compressed code fragments stored on the non-volatile memory, and the controller to load the decompressed code on the non-volatile memory wherein, the controller to decompress the compressed code in fragments if the compressed code is written in fragments.

22. The system of claim 21, including the controller to write other code in the non-volatile memory after the compressed code is erased.

23. The system of claim 21, including the processor to execute a program stored as decompressed code on the non-volatile memory.

24. The system of claim 21, wherein the electronic device is a cellular telephone.

* * * * *